(12) United States Patent
Wu et al.

(10) Patent No.: US 12,101,061 B1
(45) Date of Patent: Sep. 24, 2024

(54) HARMONIC OSCILLATOR REALIZING HARMONIC TUNING BASED ON HARMONIC CURRENT SELECTION

(71) Applicant: THE CHINESE UNIVERSITY OF HONG KONG, SHENZHEN, Shenzhen (CN)

(72) Inventors: Liang Wu, Shenzhen (CN); Zehui Kang, Shenzhen (CN); Chen Yu, Shenzhen (CN)

(73) Assignee: THE CHINESE UNIVERSITY OF HONG KONG, SHENZHEN, Shenzhen (CN)

( * ) Notice: Subject to any disclaimer, the term of this patent is extended or adjusted under 35 U.S.C. 154(b) by 0 days.

(21) Appl. No.: 18/644,202

(22) Filed: Apr. 24, 2024

(30) Foreign Application Priority Data

Sep. 1, 2023 (CN) .......................... 202311123493.3

(51) Int. Cl.
*H03B 5/12* (2006.01)
(52) U.S. Cl.
CPC .................. *H03B 5/1212* (2013.01)
(58) Field of Classification Search
USPC ..................................................... 331/117 FE
See application file for complete search history.

(56) References Cited

U.S. PATENT DOCUMENTS

| 2016/0099681 A1* | 4/2016 | Zong | ................... H03B 5/1265 |
| | | | 331/117 FE |
| 2020/0136556 A1* | 4/2020 | Lin | ..................... H03B 5/1203 |

* cited by examiner

*Primary Examiner* — Joseph Chang
(74) *Attorney, Agent, or Firm* — Bayramoglu Law Offices LLC

(57) ABSTRACT

A harmonic oscillator realizing harmonic tuning based on harmonic current selection is provided. The harmonic oscillator includes a first MOS transistor M1, a second MOS transistor M2, a first inductor L1, a second inductor L2, a third inductor L3, a fourth inductor L4, a fifth inductor L5, a first variable capacitor C1, a second capacitor C2, a first fixed capacitor C3, a second fixed capacitor C4 and a switched capacitor array SCA. By suppressing a second harmonic current and promoting a third harmonic current, the invention avoids the design complexity caused by synchronous tuning of two types of harmonic impedances. By suppressing a second harmonic current and promoting a third harmonic current, the design complexity caused by synchronous tuning of two types of harmonic impedances is avoided.

4 Claims, 6 Drawing Sheets

HARMONIC OSCILLATOR REALIZING HARMONIC TUNING BASED ON HARMONIC CURRENT SELECTION

CROSS-REFERENCE TO THE RELATED APPLICATIONS

This application is based upon and claims priority to Chinese Patent Application No. 202311123493.3, filed on Sep. 1, 2023, the entire contents of which are incorporated herein by reference.

TECHNICAL FIELD

The invention relates to harmonic oscillators, in particular to a harmonic oscillator realizing harmonic tuning based on harmonic current selection.

BACKGROUND OF THE INVENTION

The noise coefficient of existing harmonic oscillators is generally optimized by means of a harmonic voltage to fulfill good performance of the harmonic oscillators. However, when the fundamental frequency of harmonic oscillators is tuned, the amplitude and phase of the harmonic voltage will change obviously, which in turn makes the noise coefficient of the oscillators deviate from a designed optimal value, thus leading to a drastic change of the overall performance (FoM) of the oscillators within the whole tuning range.

To solve this problem, when the fundamental frequency of an oscillator is tuned, the harmonic impedance is manually tuned at the same time to keep the amplitude and phase of the harmonic voltage unchanged before and after the fundamental frequency is tuned, to maintain stable overall performance of the oscillator within the whole tuning range. However, synchronous tuning of the fundamental frequency and the harmonic impedance will greatly increase the tuning difficulty and time of the oscillator.

BRIEF SUMMARY OF THE INVENTION

The objective of the invention is to overcome the defects in the prior art by providing a harmonic oscillator realizing harmonic tuning based on harmonic current selection, which avoids, by suppressing a second harmonic current and promoting a third harmonic current, the design complexity caused by synchronous tuning of two types of harmonic impedances.

The objective of the invention is fulfilled by the following technical solution: a harmonic oscillator realizing harmonic tuning based on harmonic current selection comprises a first MOS transistor M1, a second MOS transistor M2, a first inductor L1, a second inductor L2, a third inductor L3, a fourth inductor L4, a fifth inductor L5, a first variable capacitor C1, a second capacitor C2, a first fixed capacitor C3, a second fixed capacitor C4 and a switched capacitor array SCA.

A gate of the first MOS transistor M1 is connected to a power supply terminal VDD sequentially through the first inductor L1 and the third inductor L3, a gate of the second MOS transistor M2 is connected to the power supply terminal VDD sequentially through the second inductor L2 and the fourth inductor L4, a drain of the first MOS transistor M1 is connected between the second inductor L2 and the fourth inductor L4, and a drain of the second MOS transistor M2 is connected between the first inductor L1 and the third inductor L3; a first terminal of the first fixed capacitor C3 is connected between the first inductor L1 and the third inductor L3, a second terminal of the first fixed capacitor C3 is connected to a first terminal of the second fixed capacitor C4, and a second terminal of the second fixed capacitor C4 is connected between the second inductor L2 and the fourth inductor L4.

A source of the first MOS transistor M1 is connected to a source of the second MOS transistor, a first terminal of the fifth inductor L5 is connected between the source of the first MOS transistor M1 and the source of the second MOS transistor, and a second terminal of the fifth inductor L5 is grounded.

A first terminal of the first variable capacitor C1 is connected to the gate of the first MOS transistor M1, a second terminal of the first variable capacitor C1 is connected to a first terminal of the second variable capacitor C2, and a second terminal of the second variable capacitor C2 is connected to the gate of the second MOS transistor M2; a bias input port is connected between the first variable capacitor C1 and the second variable capacitor C2.

A first terminal of the switched capacitor array is connected to the first terminal of the first variable capacitor C1, and a second terminal of the switched capacitor array is connected to the second terminal of the second variable capacitor C2.

The invention has the following beneficial effects: by suppressing a second harmonic current and promoting a third harmonic current, the design complexity caused by synchronous tuning of two types of impedances is avoided; and a smooth third harmonic impedance is created to keep the amplitude and phase of a third harmonic voltage basically unchanged within the tuning range of the oscillator during fundamental frequency tuning, such that good overall performance is fulfilled by means of the third harmonic voltage, and the overall performance (FoM) of the oscillator can be maintained stable within the tuning range without manual tuning of the third harmonic impedance.

DETAILED DESCRIPTION OF THE INVENTION

The technical solution of the invention is described in further detail below in conjunction with accompanying drawings, and the protection scope of the invention is not limited to the following description.

Figure 1:
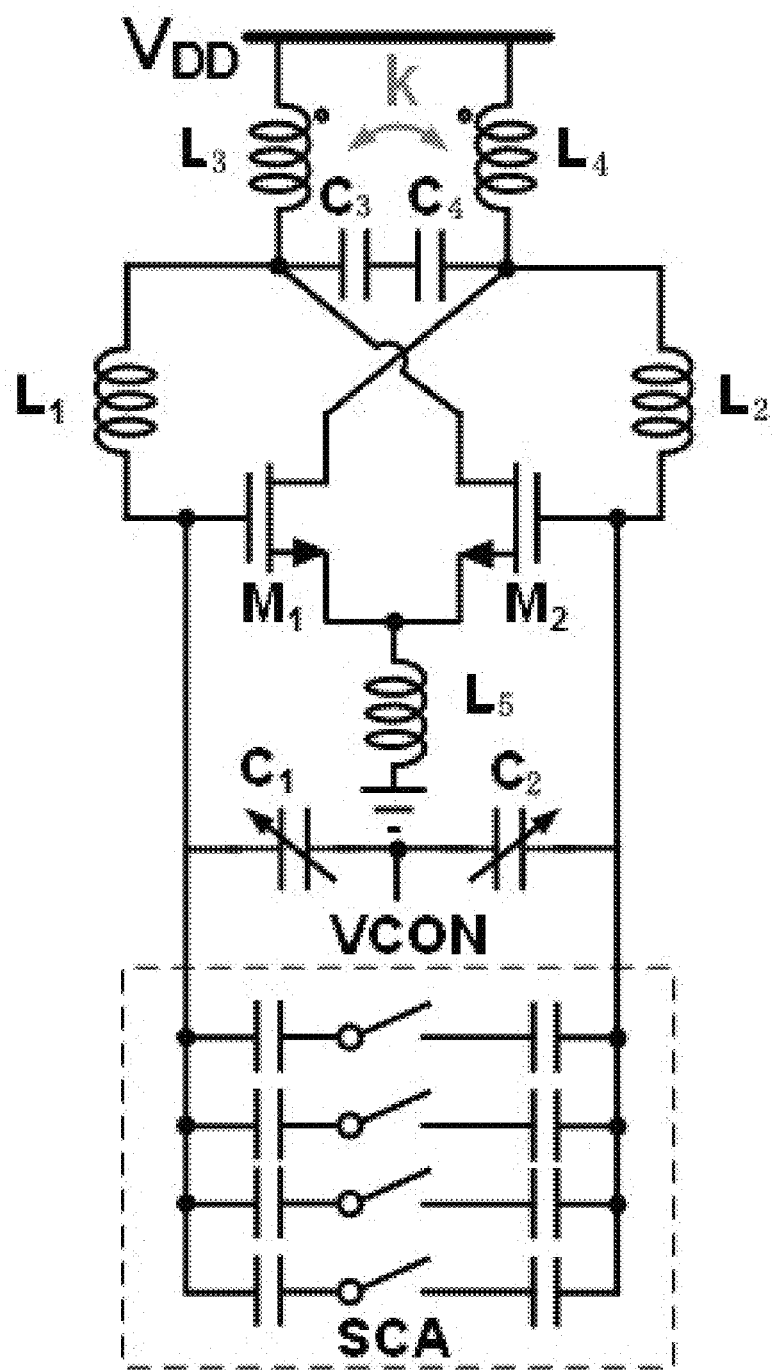
FIG. 1 is a schematic diagram of the principle of the invention.

As shown in FIG. 1, a harmonic oscillator realizing harmonic tuning based on harmonic current selection comprises a first MOS transistor M1, a second MOS transistor M2, a first inductor L1, a second inductor L2, a third inductor L3, a fourth inductor L4, a fifth inductor L5, a first variable capacitor C1, a second capacitor C2, a first fixed capacitor C3, a second fixed capacitor C4 and a switched capacitor array SCA.

A gate of the first MOS transistor M1 is connected to a power supply terminal VDD sequentially through the first inductor L1 and the third inductor L3, a gate of the second MOS transistor M2 is connected to the power supply terminal VDD sequentially through the second inductor L2 and the fourth inductor L4, a drain of the first MOS transistor M1 is connected between the second inductor L2 and the fourth inductor L4, and a drain of the second MOS transistor M2 is connected between the first inductor L1 and the third inductor L3; a first terminal of the first fixed capacitor C3 is connected between the first inductor L1 and the third inductor L3, a second terminal of the first fixed capacitor C3 is connected to a first terminal of the second fixed capacitor C4, and a second terminal of the second fixed capacitor C4 is connected between the second inductor L2 and the fourth inductor L4.

A source of the first MOS transistor M1 is connected to a source of the second MOS transistor, a first terminal of the fifth inductor L5 is connected between the source of the first MOS transistor M1 and the source of the second MOS transistor, and a second terminal of the fifth inductor L5 is grounded.

A first terminal of the first variable capacitor C1 is connected to the gate of the first MOS transistor M1, a second terminal of the first variable capacitor C1 is connected to a first terminal of the second variable capacitor C2, and a second terminal of the second variable capacitor C2 is connected to the gate of the second MOS transistor M2; a bias input port is connected between the first variable capacitor C1 and the second variable capacitor C2 and used for inputting a bias voltage VCON.

A first terminal of the switched capacitor array is connected to the first terminal of the first variable capacitor C1, and a second terminal of the switched capacitor array is connected to the second terminal of the second variable capacitor C2.

In the embodiments of the application, the first MOS transistor M1 and the second MOS transistor M2 are both NMOS transistors. The switched capacitor array SCA comprises multiple switched capacitor units, and each switched capacitor unit comprises a switch and two capacitor tubes.

In each switched capacitor unit, one terminal of a first capacitor tube is connected to the first terminal of the switched capacitor array SCA, and the other terminal of the first capacitor tube is connected to the second terminal of the switched capacitor array SCA sequentially through the switch and a second capacitor tube.

Figure 2:
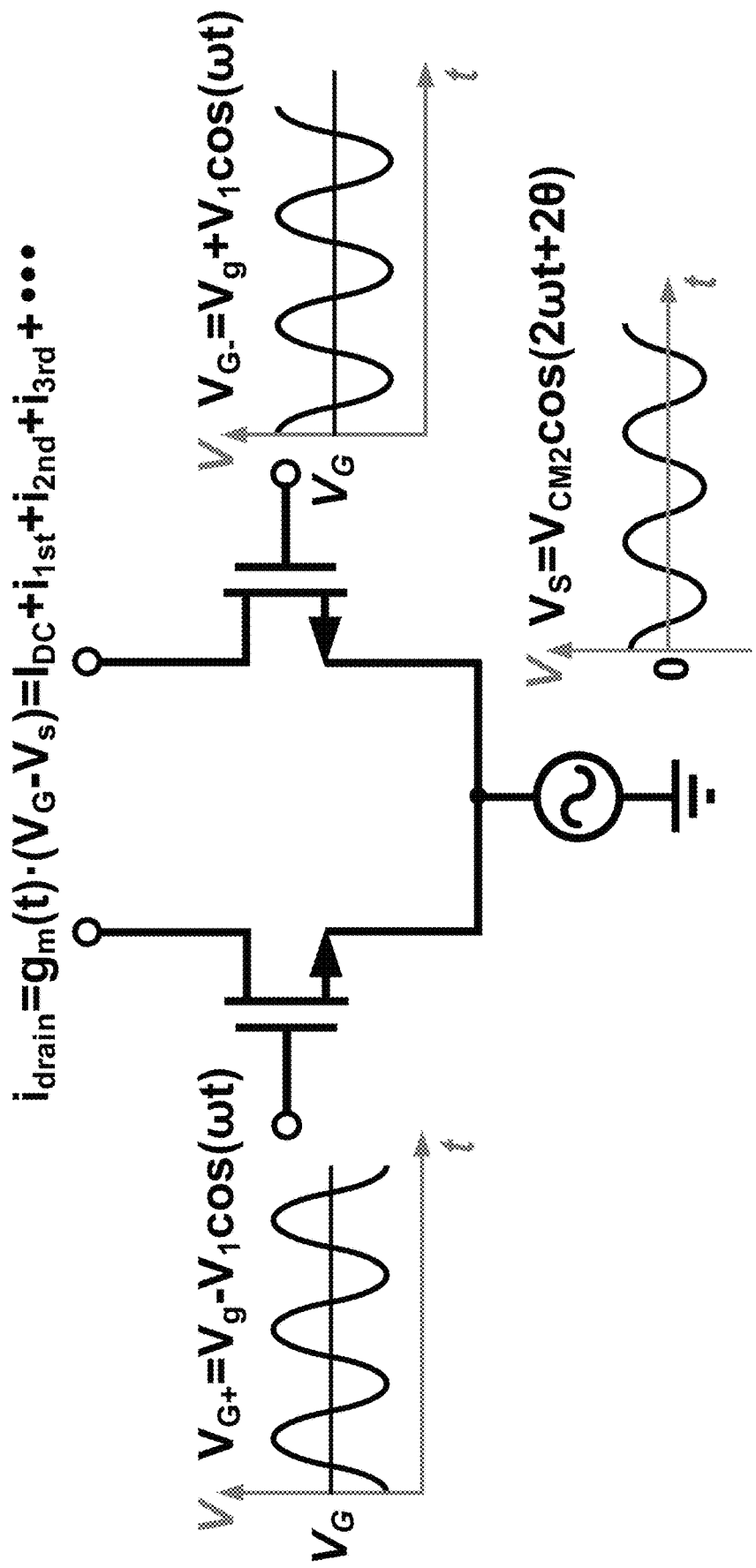
FIG. 2 is a schematic diagram of the principle of driving a DC bias voltage of a differential MOS transistor by a differential input.

The operating principle of the invention is as follows:

In the embodiments of the application, as shown in FIG. 2 which illustrates the principle of driving a DC bias voltage of a differential MOS transistor by a differential input, the DC bias voltage $V_G$ of the differential MOS transistor is driven by the differential input $V_1 \cos(\omega t)$. A signal source capable of generating a second harmonic signal $\cos(2\omega t)$ with an amplitude $V_{CM2}$ and a phase $2\theta$ is arranged at a common-source terminal of the two transistors. A current $i_{drain}$ of the drain of the transistor may be expressed as:

$$i_{drain} = g_m \cdot (V_G - V_S). \tag{1}$$

$g_m$ is transconductance, $V_G$ and $V_S$ are DC voltages of the gate and the source, and $V_{th}$ is a threshold voltage.

In each cycle $(-\pi, \pi)$, $g_m$ can be expressed as:

$$g_m(t) = \begin{cases} g_{m0} \cdot \left(\cos(\omega t) - \cos\left(\frac{\varphi}{2}\right)\right), & -\frac{\varphi}{2} \le \omega t \le \frac{\varphi}{2} \\ 0, & \frac{\varphi}{2} \le |\omega t| \le \pi \end{cases} \tag{2}$$

$\varphi$ is a conduction angle and is expressed as:

$$\varphi = 2 \cdot \cos^{-1}\left(\frac{V_G - V_{th}}{V_1}\right), \tag{3}$$

Fourier expansion is performed on (2) to obtain:

$$g_m(t) = g_{m0} \cdot \left\{\frac{a_0}{2} + \sum_{k=1}^{\infty} [a_k \cos(k\omega t)]\right\}, \tag{4}$$

$$a_0 = \frac{2}{\pi}\left[2\sin\left(\frac{\varphi}{2}\right) - \varphi\cos\left(\frac{\varphi}{2}\right)\right], \tag{5}$$

$$a_1 = \frac{1}{2\pi}[\varphi - \sin(\varphi)], \tag{6}$$

$$a_k = \frac{1}{\pi}\left\{\frac{\sin\left[\frac{(k+1)\varphi}{2}\right]}{k+1} + \frac{\sin\left[\frac{(k-1)\varphi}{2}\right]}{k-1} - \frac{1}{k}\cos\left(\frac{\varphi}{2}\right)\sin\left(\frac{k\varphi}{2}\right)\right\}, \tag{7}$$

$$k = 2, 3 \ldots$$

(4) is substituted into (1):

$$i_{drain} = g_{m0} \cdot \left\{\frac{a_0}{2} + \sum_{k=1}^{\infty}[a_k \cos(k\omega t)]\right\} \cdot (V_G - V_{th} - V_S) = \tag{8}$$

$$g_{m0}\left\{\frac{a_0}{2} + \sum_{k=1}^{\infty}[a_k \cos(k\omega t)]\right\}(V_G - V_{CM2}\cos(2\omega t + 2\theta)).$$

wherein, a second harmonic current $i_{2\omega t}$ and a third harmonic current $i_{3\omega t}$ are expressed as:

$$i_{2\omega t} = g_{m0} \cdot \left[a_2 V_G \cos(2\omega t) - \frac{a_0}{2} V_{CM2} \cos(2\omega t + 2\theta)\right]. \tag{9}$$

$$i_{3\omega t} = g_{m0} \cdot \left[a_3 V_G \cos(3\omega t) - \frac{a_1}{2} V_{CM2} \cos(3\omega t + 2\theta)\right]. \tag{10}$$

Figure 3:
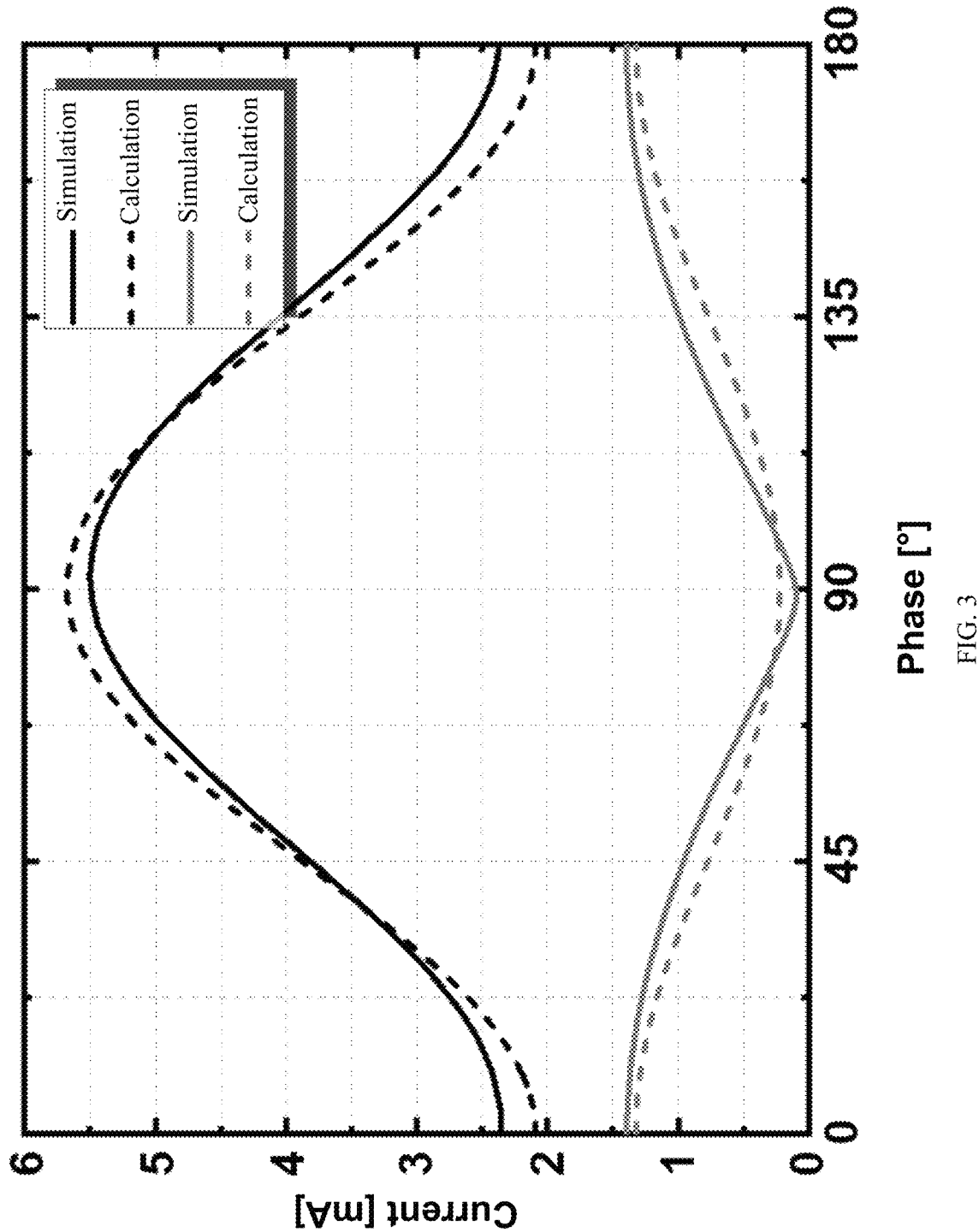
FIG. 3 illustrates the relationship between a third harmonic current and a second harmonic voltage of a common-source terminal in one embodiment.

It can be seen from (9) and (10) that depending on whether $a_0$, $a_1$, $a_2$ and $a_3$ are positive numbers or negative numbers and the phase $\theta$, the harmonic currents can be restrained or promoted. Under the condition where $V_G$=0.6 V, $\theta$=3.8, $g_{m0}$=31 mS and $V_{CM2}$=50 mV, it can be figured out that $a_0$, $a_1$ and $a_2$ are positive numbers, and $a_3$ is a negative number. The change of the second harmonic current $i_{2\omega t}$ and the third harmonic current $i_{3\omega t}$ with the phase $\theta$ is shown in FIG. 3.

It can be known from (9) that when $2\theta$ is equal to $0°$, $a_2 V_G \cos(2\omega t)$ and $-0.5 a_0 V_{CM2} \cos(2\omega t + 2\theta)$ are identical in phase, and $i_{2\omega t}$ is minimized; when $2\theta$ is equal to $180°$, $i_{2\omega t}$ is maximized. Similarly, when $2\theta$ is equal to $0°$, $i_{3\omega t}$ is maximized; when $2\theta$ is equal to $180°$, $i_{3\omega t}$ is maximized. This indicates that by adding a second harmonic voltage to the common-source terminal of the transistors and changing the phase and amplitude of the second harmonic voltage, the third harmonic current of the drain can be promoted while the second harmonic current of the drain is restrained.

In the application, the first inductor L1, the second inductor L2, the first variable capacitor C1, the second variable capacitor C2 and the switched capacitor array SCA (which is a four-bit switched capacitor array in the application) form a fundamental resonator. Coarse adjustment of the frequency can be realized by changing the switched capacitor array, and continuous adjustment of the frequency can be realized by changing the bias voltage VCON of the variable capacitor C1.

The third inductor L3 and the fourth inductor L4, as coupling inductors, form a third harmonic resonator together with the first fixed capacitor C3 and the second fixed capacitor C4, and a third harmonic impedance is created to work together with the third harmonic current of the MOS transistors M1 and M2 to obtain a third harmonic voltage, and the third harmonic voltage is used for optimizing the noise coefficient of the oscillator.

Under the action of the first inductor L1 and the second inductor L2, the amplitude of oscillation is amplified when signals are transmitted from the drains the MOS transistors M1 and M2 to the gates, and a greater gate-drain voltage is more beneficial for suppressing phase noise of the oscillator.

Figure 4:
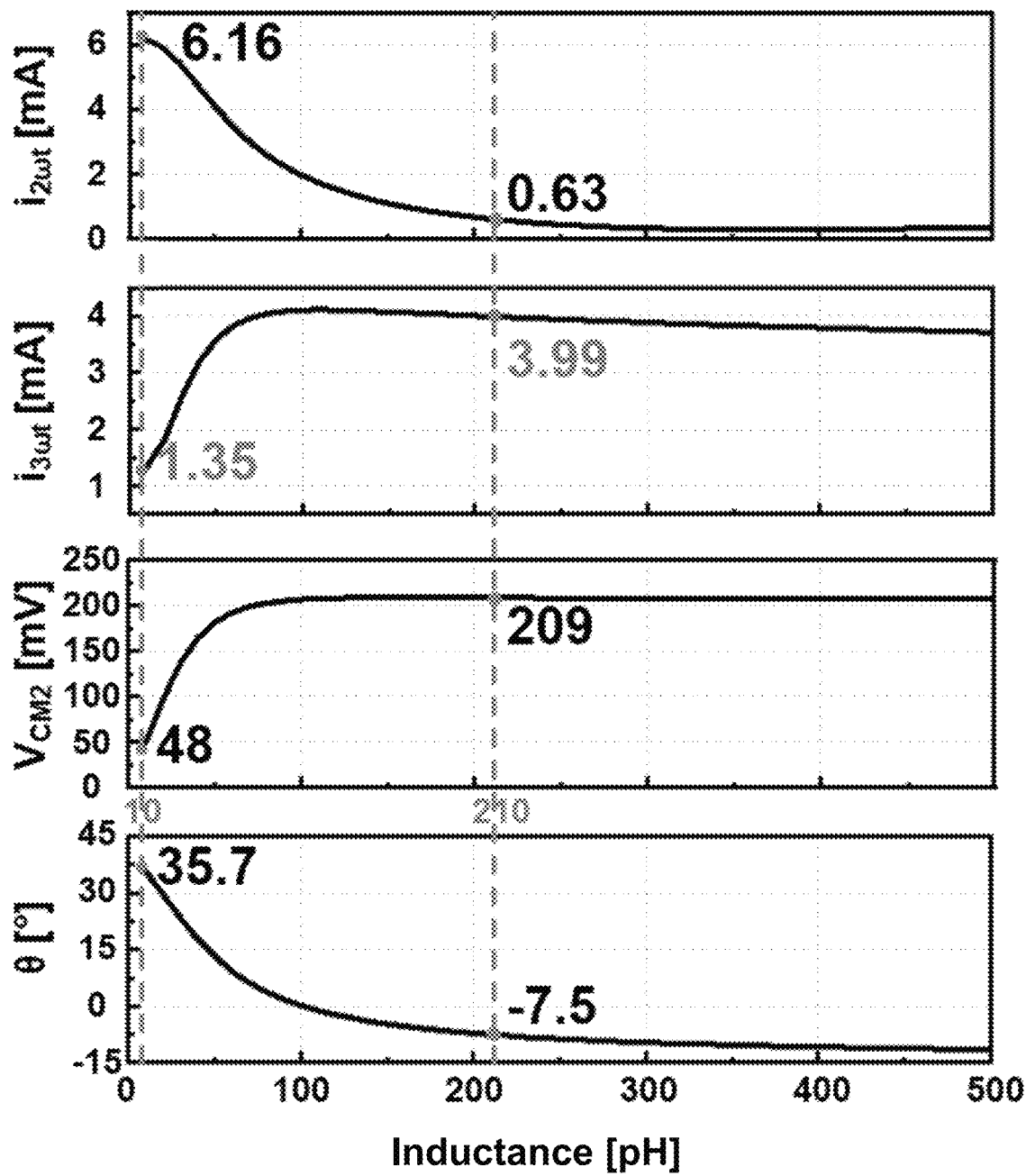
FIG. 4 is a schematic variation chart of $i_{2\omega_f}$, $i_{3\omega_f}$, $v_{CM2}$ and $\theta$ with the inductance of tail inductors.

Different from other harmonic oscillators, a desired second harmonic voltage is generated by adding the tail inductors L1 and L2 at the common-source terminal rather than designing a second harmonic impedance in the resonator, and the phase of the second harmonic voltage of the common-source terminal is adjusted by changing the inductance of the tail inductors. As shown in FIG. 4, the inductance of the tail inductors is scanned; when the inductance of the tail inductors is 210 pH, the second harmonic current of the drain is decreased from 6.16 mA to 0.63 mA and the third harmonic current is increased from 1.35 mA to 3.99 mA as compared with a case where the tail inductors are not added.

The weak second harmonic current will not produce a second harmonic voltage in the circuit, which fulfills the following two advantages: first, a second harmonic voltage for adjusting the noise coefficient of the oscillator is abandoned, such that a second harmonic impedance does not need to be designed in the circuit anymore, thus reducing the design complexity and avoiding trouble caused by manual tuning of the second harmonic impedance when the fundamental frequency is tuned; second, considering that the second harmonic current will enter the fundamental resonator more easily and deteriorate the performance of the oscillator if there is no second harmonic impedance in the oscillator, the second harmonic current is greatly restrained in the design of the application, so compared with oscillators with a second harmonic impedance, the overall performance of the oscillator designed in the invention is not deteriorated and is even better. It should be noted that the tail inductors L1 and L2 may not be in the form of inductors and may be any structures that can provide corresponding inductance, such as transmission lines in various shapes, to fulfill the desired effect of the design of the application.

Figure 5:
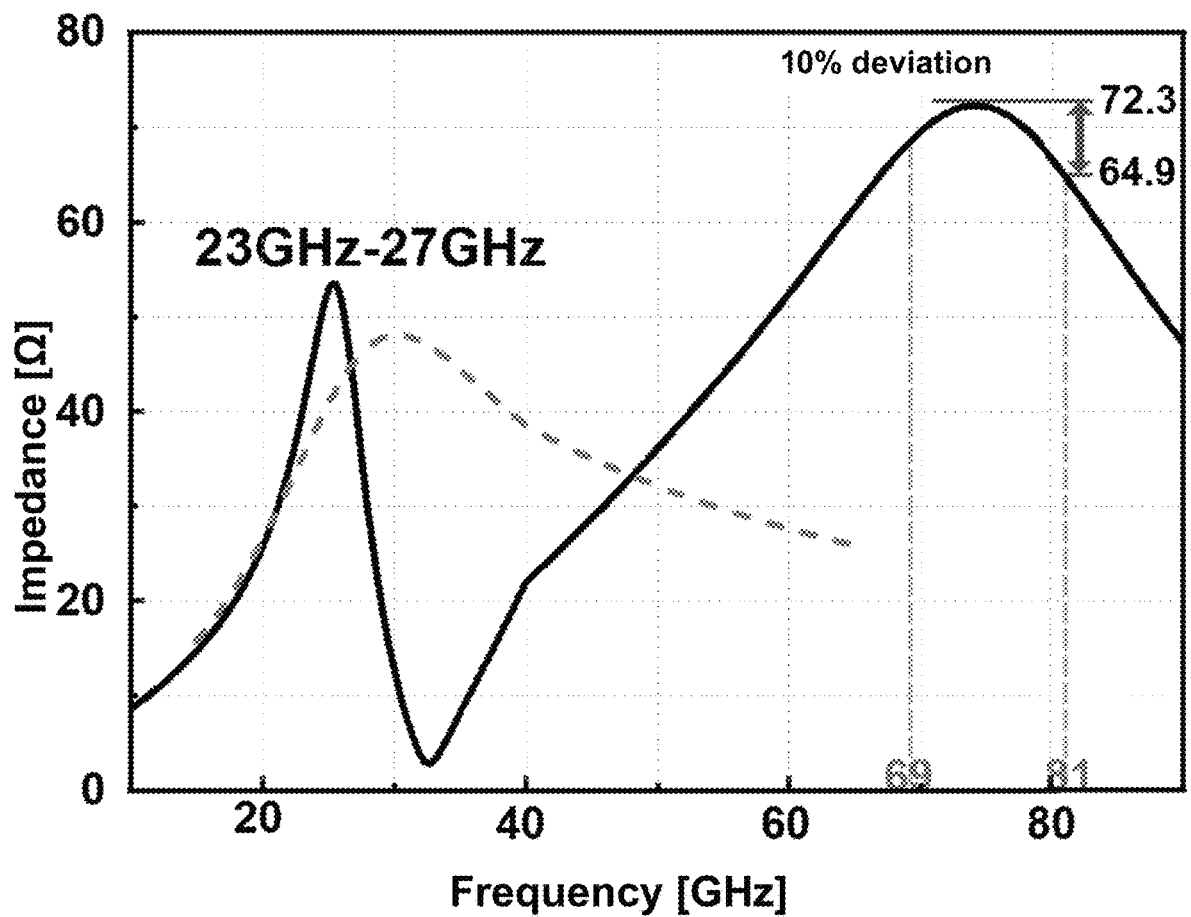
FIG. 5 is a schematic diagram of a differential-mode impedance and a common-mode impedance of an oscillator during insulation according to the application.

Compared with other oscillators, the design with a more intense third harmonic current in the application can obtain an equal-amplitude third harmonic voltage by means of a smoother third harmonic impedance with a smaller amplitude. The smoother third harmonic impedance allows for a smaller change of the phase and amplitude of the third harmonic voltage of the design under the same frequency change, so the harmonic voltage does not need to be manually tuned. As shown in FIG. 5, under the condition where the third harmonic impedance is not tuned, the impedance only changes by 10% within the whole frequency tuning range.

Figure 6:
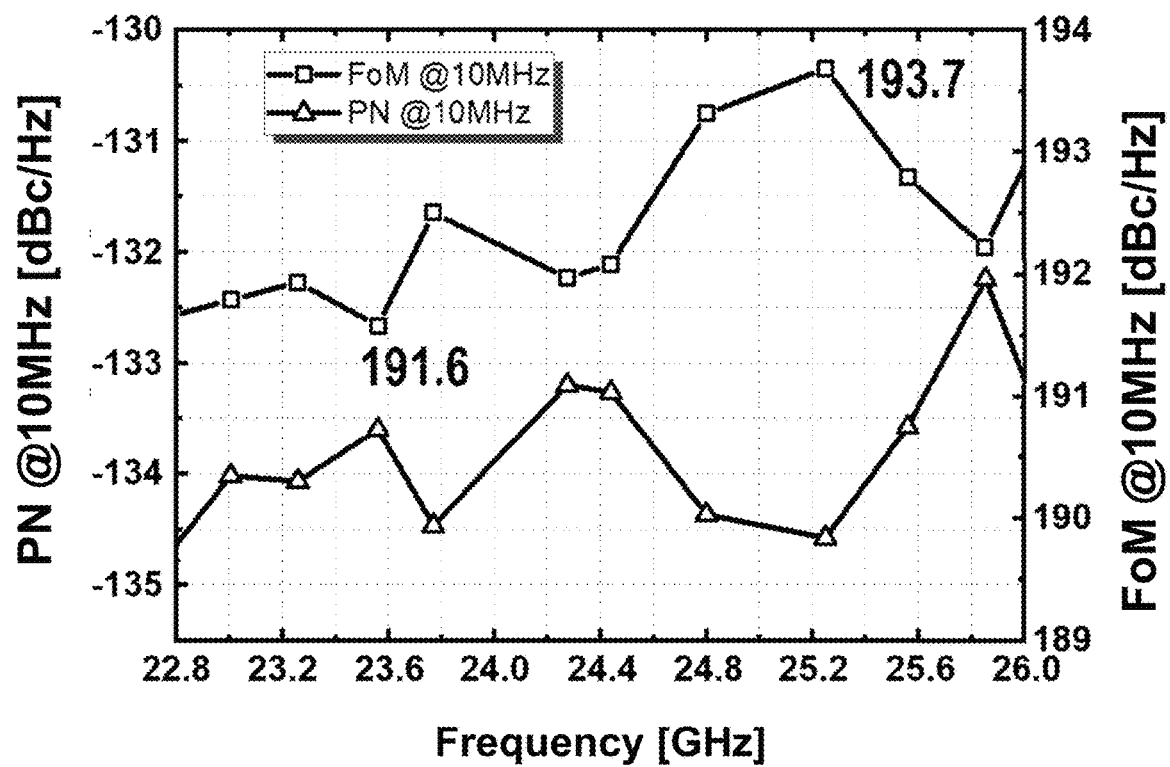
FIG. 6 is a variation chart of noise and FoM at 10 MHz with frequency in the absence of manual tuning of harmonic impedance in one embodiment.

In the embodiments of the application, the operating range of the oscillator provided by the application is from 22.77 GHz to 26.03 GHz, and the tuning range is 13.4%. When the frequency is tuned to 25.26 GHZ, the measured phase noise at 10 MHz is-134.58 dBc/Hz, and the corresponding FoM is 193.7 dBc/Hz. The power of a chip is 7.8 mW, and the supply voltage is 0.56 V. It can be seen, from FIG. 6 which is a variation chart of the noise and FoM at 10 MHz with frequency in the absence of manual tuning of harmonic impedances, that in absence of manual tuning of harmonic impedances, the change of the overall performance (FoM) of the design within the whole tuning range is merely 2.1 dB, indicating that the overall performance of the oscillator can be maintained stable within the tuning range without manual tuning of harmonic impedances.

Latest performance parameters of the oscillator are summarized in the following Table.

|  | This Work | ISSCC'19 [25] | ISSCC'20 [29] | JSSC'18 [28] | JSSC'18 [15] |
|---|---|---|---|---|---|
| Topology | DHCM | RLCM | S2G feedback | Class-F23 | Quad-Cores |
| Frequency (GHz) | 22.77-26.03 | 25.5-29.9 | 18.3-21.2 | 27.3-31.2 | 23.0-29.9 |
| Tuning range (%) | 13.4 | 16 | 14.5 | 14 | 26 |
| Supply voltage (V) | 0.56 | 0.48 | 0.9 | 1 | 0.95 |
| Power (mW) | 7.8 | 3.8 | 9 | 12 | 16 |
| Phase noise (dBc/Hz) @10 MHz | −134.5 | −128* | −128.8* | −106 | −130.4* |
| FoM (dBc/Hz) @10 MHz | 191.6-193.7 | 188.2-190.3 | 183.5-185.2 | 184 | 186.5-187 |
| $FoM_T$ @10 MHz (dBc/Hz) | 196.2 | 194.4 | 188.4 | 186.9 | 195.3 |
| Core area (mm$^2$) | 0.12 | 0.08 | 0.12 | 0.15 | 0.1 |
| Process | 65 nm CMOS | 65 nm CMOS | 65 nm CMOS | 28 nm CMOS | 40 nm CMOS |

It indicates, by comparison, that the overall performance (FoM) of the harmonic oscillation designed in the application is at the leading level as compared with millimeter-wave band harmonic oscillators; and manual tuning of harmonic impedances is avoided, thus reducing the tuning complexity of the harmonic oscillator and fulfilling good overall performance of the oscillator.

One preferred embodiment of the invention is illustrated and described above. As mentioned above, it should be understood that the above embodiment is not intended to limit the invention or exclude other embodiments, the invention can be applied to various other combinations, amendments and environments, and within the scope of the concept of the invention, modifications can be made based on the above enlightenments or techniques or knowledge in related fields. All modifications and variations made by those skilled in the art without departing from the spirit and scope of the invention should also fall within the protection scope of the appended claims of the invention.

What is claimed is:

1. A harmonic oscillator realizing harmonic tuning based on harmonic current selection, comprising a first MOS transistor, a second MOS transistor, a first inductor, a second inductor, a third inductor, a fourth inductor, a fifth inductor, a first variable capacitor, a second variable capacitor, a first fixed capacitor, a second fixed capacitor and a switched capacitor array SCA;

a gate of the first MOS transistor is connected to a power supply terminal VDD sequentially through the first inductor and the third inductor, a gate of the second MOS transistor is connected to the power supply terminal VDD sequentially through the second inductor and the fourth inductor, a drain of the first MOS transistor is connected between the second inductor and the fourth inductor, and a drain of the second MOS transistor is connected between the first inductor and the third inductor; a first terminal of the first fixed capacitor is connected between the first inductor and the third inductor, a second terminal of the first fixed capacitor is connected to a first terminal of the second fixed capacitor, and a second terminal of the second fixed capacitor is connected between the second inductor and the fourth inductor;

a source of the first MOS transistor is connected to a source of the second MOS transistor, a first terminal of the fifth inductor is connected between the source of the first MOS transistor and the source of the second MOS transistor, and a second terminal of the fifth inductor is grounded;

a first terminal of the first variable capacitor is connected to the gate of the first MOS transistor, a second terminal of the first variable capacitor is connected to a first terminal of the second variable capacitor, and a second terminal of the second variable capacitor is connected to the gate of the second MOS transistor; a bias input port is connected between the first variable capacitor and the second variable capacitor;

a first terminal of the switched capacitor array is connected to the first terminal of the first variable capacitor, and a second terminal of the switched capacitor array is connected to the second terminal of the second variable capacitor.

2. The harmonic oscillator realizing the harmonic tuning based on the harmonic current selection according to claim 1, wherein the first MOS transistor and the second MOS transistor are both NMOS transistors.

3. The harmonic oscillator realizing the harmonic tuning based on the harmonic current selection according to claim 1, wherein the switched capacitor array SCA comprises a plurality of switched capacitor units, and each of the plurality of switched capacitor units comprises a switch, and first and second capacitor tubes;

in each of the plurality of switched capacitor units, a first terminal of the first capacitor tube is connected to the first terminal of the switched capacitor array SCA, and a second terminal of the first capacitor tube is connected to the second terminal of the switched capacitor array SCA sequentially through the switch and the second capacitor tube.

4. The harmonic oscillator realizing the harmonic tuning based on the harmonic current selection according to claim 1, wherein the bias input port is configured for inputting a bias voltage VCON.

* * * * *